(12) United States Patent
Bourgoin et al.

(10) Patent No.: US 7,504,873 B2
(45) Date of Patent: Mar. 17, 2009

(54) VOLTAGE LEVEL SHIFTING DEVICE

(75) Inventors: Jérôme Bourgoin, Fontaine (FR); Gilles Troussel, Grenoble (FR)

(73) Assignee: STMicroelectronics SA, Montrouge (FR)

( * ) Notice: Subject to any disclaimer, the term of this patent is extended or adjusted under 35 U.S.C. 154(b) by 0 days.

(21) Appl. No.: 11/400,018

(22) Filed: Apr. 7, 2006

(65) Prior Publication Data

US 2006/0238232 A1    Oct. 26, 2006

(30) Foreign Application Priority Data

Apr. 7, 2005    (FR)    .................................. 05 03492

(51) Int. Cl.
*H03L 5/00*    (2006.01)
(52) U.S. Cl. .......................... 327/333; 327/390; 326/63
(58) Field of Classification Search ................. 325/333, 325/390
See application file for complete search history.

(56) References Cited

U.S. PATENT DOCUMENTS

| | | | | |
|---|---|---|---|---|
| 5,969,557 | A * | 10/1999 | Tanzawa et al. | 327/291 |
| 2004/0155892 | A1 | 8/2004 | Tsuchi | 345/690 |
| 2004/0160258 | A1 | 8/2004 | Tobita | 327/333 |
| 2006/0028193 | A1 * | 2/2006 | Migliavacca | 323/316 |
| 2006/0044054 | A1 * | 3/2006 | Yamazaki et al. | 327/540 |
| 2006/0238232 | A1 * | 10/2006 | Bourgoin et al. | 327/333 |
| 2006/0250167 | A1 * | 11/2006 | Kato et al. | 327/77 |
| 2006/0267641 | A1 * | 11/2006 | Khan et al. | 327/108 |

OTHER PUBLICATIONS

French Search Report, FR 0503492; Nov. 25, 2005.
Doutreloigne, et al "A Versatile Micropower High-Voltage Flat-Panel Display Driver in a 100-V 0.7-µm CMOS Intelligent Interface Technology"; IEEE Journal of Solid-State Circuits; Dec. 2001; pp. 2039-2048; vol. 36, No. 12; NJ, US.
Doutreloigne "A Monolithic Low-Power High-Voltage Driver for Bistable LCDs"; Microelectronics, 2004, ICM 2004 Proceedings, The 16th International Conference on Tunis, Tunisia, Dec. 6-8; IEEE; Dec. 2004; pp. 425-428; NJ, US.
Yu "Novel Low Power Class-B Output Buffer"; Circuits and Systems, ISCAS '98 Proceedings of the 1998 IEEE International Symposium on Monterey, CA May 31-Jun. 3, 1998; pp. 633-636; vol. 6; NY, NY, US.

* cited by examiner

*Primary Examiner*—Tuan Lam
*Assistant Examiner*—Hiep Nguyen
(74) *Attorney, Agent, or Firm*—Hogan & Hartson LLP

(57) ABSTRACT

A voltage level shifting device includes an activation or deactivation control input, first and second output nodes, a capacitor coupled between the output nodes, a high-voltage transistor for charging the capacitor, a high-voltage transistor for discharging the capacitor, a comparator which generates a charge blocking signal and a discharge signal, and a control device which is operative to cause the charging transistor to be blocked when a charge blocking signal is generated and to turn on the discharging transistor upon receipt of a deactivation control signal and when a discharge signal is generated.

20 Claims, 4 Drawing Sheets

VOLTAGE LEVEL SHIFTING DEVICE

RELATED APPLICATION

The present application claims priority of French Patent Application No. 0503492 filed Apr. 7, 2005, which is incorporated herein in its entirety by this reference.

FIELD OF THE INVENTION

This invention relates to power supply devices and in particular voltage level shifting devices.

BACKGROUND OF THE INVENTION

Integrated circuits, such as display drivers, use control voltages of up to 100 volts while being controlled by standard 5-volt CMOS logic circuits. Thus, complex voltage level shifting devices are needed to convert a 5-V signal into an output signal with the desired level. As such devices are commonly integrated into battery-powered apparatuses, they must have the lowest possible power consumption.

Cholesteric liquid crystal screens have been developed and are used in particular in apparatuses having a very low image modification frequency. Such screens are used for their capacity to store the image in the absence of a power supply, but require the application of voltages on the order of 50 to 100 volts over their pixel lines in order for the image to be modified. Such screens thus require display drivers supplying such voltages with an extremely low power consumption.

A known display driver has three voltage sources having different levels that must be selectively applied to a pixel by an output node Vout. A first source supplies a high voltage, a second source supplies an intermediate voltage, and a third source supplies a low voltage. The second voltage source includes a so-called static voltage shifting device. Such a voltage shifting device converts a low-voltage signal for controlling an analog switch equipped with high-voltage PMOS transistors T1 and T2 mounted head-to-tail as shown in FIG. 1. This head-to-tail assembly makes it possible to switch from the high voltage to the intermediate voltage without returning to the low voltage. The transistors T1 and T2 also form two parasitic diodes D1 and D2 arranged head-to-tail. The drain of transistor T2 is coupled to a high-voltage power supply Hv and the drain of transistor T1 is coupled to the output node Vout. The sources of transistors T1 and T2 are coupled to one another. The output voltage on the node Vout is determined by the difference in voltage between the source of T4 and the drain of T3. This voltage difference is generated by the current supplied by a current source Ibias and passing through diode-connected transistors T3 and T4.

The disadvantage of such a voltage level shifting device is that the current source Ibias continuously consumes power. Such a continuous power consumption is unacceptable for a battery power supply.

FIG. 2 shows a so-called dynamic voltage level shifting device controlling an analog switch equipped with high voltage PMOS transistors T1 and T2. This device is also described in *A New Architecture for Monolithic Low-Power High-Voltage Display Driver* by Doutreloigne, De Smet and Van Calster of the University of Gant (ISSN1083-1312/00/2001-0115). This device uses a dynamic gate charge control for transistors T1 and T2 so as to suppress the static consumption of the voltage level shifting device of FIG. 1.

The sources of transistors T1 and T2 are coupled to one another. The gates of transistors T1 and T2 are coupled to one another. The drain of T2 is coupled to a high voltage power supply Hv and the drain of transistor T1 is coupled to an output node Vout. Transistors T1 and T2 also form two parasitic diodes D1 and D2.

The voltage level shifting device includes a capacitor C coupled between the source and the gate of transistors T1 and T2. The voltage level shifting device also includes standard CMOS transistors T4 to T9 for charging and discharging the capacitor C.

Transistors T5 and T7 are used for charging the capacitor C and are coupled in series between the source of transistor T1 and the ground. Transistor T5 is an NMOS power transistor receiving a charge control signal on its gate. The anode and cathode of a diode D3 are coupled respectively to the gate of T1 and to the drain of T5. Transistor T7 is a PMOS transistor having a connection between its gate and its drain.

Transistors T4, T6 and T8 are used to discharge the capacitor C. Transistors T4 and T6 are coupled in series between the source of transistor T1 and the ground. Transistor T4 is an NMOS power transistor receiving a discharge control signal on its gate. Transistor T6 is a PMOS transistor having a connection between its gate and its drain. The source of transistor T8 is coupled to the source of T1, its drain is coupled to the gate of T1 and its gate is coupled to the gate of T6.

The charge and discharge signals applied respectively to T5 and T4 have a very low cyclic ratio, so as to minimize the consumption of the voltage level shifting device.

Such a voltage level shifting device has disadvantages, however. Cyclic charge and discharge signals are necessary. In addition, the substrate surface occupied by such a device is large.

Moreover, transistors T1 and T2 are sensitive to the voltage level on the output node Vout. Thus, if another circuit applies a voltage Vout over the level Hv, a current passes through diode D1 and the capacitor C and charges the parasitic capacitances between the ground and the gate of T1. The charge of the capacitor C, of which the capacitance is limited so as to facilitate its integration, then causes transistors T1 and T2 to be turned on. Thus, the analog switch generates a parasitic consumption and the voltage on the node Vout decreases with respect to its nominal level.

SUMMARY OF THE INVENTION

The invention aims to solve one or more of these disadvantages. The invention thus relates to a voltage level shifting device which includes a control input for receiving an activation or deactivation control, first and second output nodes, a capacitor coupled between the output nodes, a high-voltage charging transistor, capable of charging the capacitor when it is on, a high discharge voltage transistor, capable of discharging the capacitor when it is on, a comparator block which generates a charge blocking signal when the voltage difference at the capacitor terminals exceeds a first threshold, and generates a discharge signal when the voltage difference at the capacitor terminals exceeds a second threshold, and a control device which causes the charging transistor to be blocked when a charge blocking signal is generated, and turns on the discharging transistor upon receipt of a deactivation control signal and when a discharge signal is generated. The comparator device may also include a voltage comparator selectively applying the charge signal and the discharge signal to its output when the voltage difference at the capacitor terminals exceeds the same threshold.

According to an alternate embodiment, the comparator includes a non-inverting input coupled to the second output node by means of two series diode-connected PMOS transistors and coupled to the ground by means of a current source, and a Zener diode of which the anode is coupled to the ground and of which the cathode is coupled to the output of the comparator.

According to yet another alternate embodiment, the comparator device includes a first voltage comparator applying the charge blocking signal to its output when the voltage difference at the capacitor terminals exceeds the first threshold, and a second voltage comparator applying the discharge signal to its output when the voltage difference at the capacitor terminals exceeds the second threshold, which is lower than the first threshold.

According to yet another alternate embodiment, the comparators each have an inverting input coupled to the first output node, the first comparator has a non-inverting input coupled to a second output node by means of two series diode-connected PMOS transistors and coupled to the ground by means of a current source, and the second comparator has a non-inverting input coupled to a second output node by means of a diode-connected PMOS transistors and coupled to the ground by means of a current source. The device further includes two Zener diodes of which the anodes are coupled to the ground and of which the cathodes are respectively coupled to the outputs of the first and second comparators.

It is possible for one of these comparators to include a first high-voltage PMOS transistor of which the gate is coupled to the first output node, a second high-voltage PMOS transistor of which the gate is coupled to the non-inverting input, a first diode-connected NMOS transistor, of which the drain is coupled to the drain of the first PMOS transistor, a second NMOS transistor of which the drain is coupled to the drain of the second PMOS transistor, of which the source and the gate are respectively coupled to the source and gate of the first NMOS transistor, a third NMOS transistor of which the drain is coupled to the output of the comparator, and of which the gate and the source are respectively coupled to the drain and source of the second NMOS transistor, a first current source coupled between the second output node and the source of the first PMOS transistor, a second current source coupled between the second output node and the comparator output, and a Zener diode of which the anode and the cathode are respectively coupled to the source and drain of the second NMOS transistor.

According to an alternate embodiment, the device includes a first diode-connected PMOS transistor, of which the source is coupled to the second output node, a second PMOS transistor of which the source is coupled to the second output node, of which the drain is coupled to the first output node, of which the gate is coupled to the drain of the first PMOS transistor. The discharging transistor is a high-voltage NMOS transistor of which the source is coupled to the ground and of which the drain is coupled to the drain of the first PMOS transistor.

According to yet another alternative, the charging transistor is a high-voltage NMOS transistor, of which the source is coupled to the ground and of which the drain is coupled to the first output node.

According to another alternative, the control device includes an AND logic gate having a first input receiving the complement of the signal applied to the control input, a second input receiving the discharge signal and an output coupled to the gate of the discharging transistor, an AND logic gate having a first input coupled to the control input, a second input receiving the charge blocking signal and an output coupled to the gate of the charging transistor.

The invention also relates to a system which includes a voltage level shifting device as defined above, and a high-voltage analog switch which includes a third output node and a power supply input, and first and second high-voltage thin gate oxide transistors, each having first and second conduction electrodes and a gate, with their gates being coupled to the first output node of the device, their second conduction electrodes being coupled to the second output node of the device, and their first conduction electrodes being coupled respectively to the high-voltage power supply input and the second output node.

Alternatively, the system includes a power supply under 35 volts coupled to the power supply input.

A voltage multiplexer of the present invention in a system as defined above preferably includes an output coupled to the output node of the system, at least one first voltage source. Included is a power supply input with a voltage level above that applied to the high-voltage power supply input of the analog switch of the system, a control input, and an output node coupled to the output of the multiplexer, and is capable of applying the voltage level of its power supply input to its output node when an appropriate control signal is applied to its control input. The system further includes a control device capable of selectively applying control signals to the respective control inputs of the voltage level shifting device of the system and of the first voltage source so that the switch of the system or the first voltage source applies the voltage level of its power supply input to the output of the multiplexer.

According to an alternative embodiment, the multiplexer also includes at least one second voltage source, having a voltage level shifting device, including, a control input coupled to the control device, fourth and fifth output nodes, first and second high-voltage thick gate oxide transistors of a first type, each having a first and a second conduction electrode and a gate, wherein the first conduction electrode of the first transistor is coupled to the fourth output node, the second conduction electrode of each of said transistors is coupled to the fifth output node, and the gate of each of said transistors is coupled to the first conduction electrode of the other of said transistors, third and fourth high-voltage CMOS transistors of a second type, each having a first conduction electrode coupled to the ground, each having a second conduction electrode, of which one is coupled to the first conduction electrode of the first transistor and of which the other is coupled to the first conduction electrode of the second transistor, wherein their gates are coupled together by means of an inverter and one of said gates is coupled to the control input, an analog switch, including an output node coupled to the output of the multiplexer and a high-voltage power supply input with a voltage level higher than that applied to the high-voltage power supply input of the analog switch of the system and lower than the voltage level of the first voltage source and first and second high-voltage thick gate oxide transistors of a first type, each having a first and a second conduction electrode and a gate, wherein their gates are coupled to the fourth output node, their second conduction electrodes are coupled to the fifth output node, their first conduction electrodes are respectively coupled to the high-voltage power supply input and the multiplexer output.

The invention may also include a display screen having a pixel matrix, wherein each pixel has two electrodes and is controlled by a difference in voltage between its electrodes, and also a display driver including a voltage multiplexer as defined above, controlling, in the control device, the application of a given voltage level on the multiplexer output, and connecting an electrode of a pixel to the output of the multiplexer.

According to an alternative embodiment, the matrix is a cholesteric liquid crystal pixel matrix.

BRIEF DESCRIPTION OF THE DRAWINGS

Other features and advantages of the invention will become clear from the description provided below, solely by way of a non-limiting example, in reference to the appended drawings, wherein.

DETAILED DESCRIPTION

The present invention comprises a voltage level shifting device controlled by a dynamic signal. The voltage level shifting device controls a control voltage difference between two outputs by the charge or discharge of a capacitor coupled between said outputs. A comparator device determines that the voltage difference between the outputs exceeds a threshold and blocks the capacitor charge. The comparator device also determines that the voltage difference between the outputs exceeds a threshold and controls the discharge of the capacitor.

The use of a dynamic control signal enables the static consumption to be reduced. The use of the comparator device makes it possible prevent overvoltage between the output terminals, and thus to protect the output transistors of an analog switch. The comparator device indeed blocks the charge of the capacitor. The use of the comparator device also makes it possible to reduce the parasitic conduction of the switch when the voltage Vout is above the level Hv applied to the analog switch: the parasitic charge of the capacitor C is detected and the comparator controls its discharge.

The invention enables a single control signal to be used. This control signal can also be continuous when the analog switch is closed. The invention also enables the consumption of the voltage level shifting device to be reduced.

Figure 1:
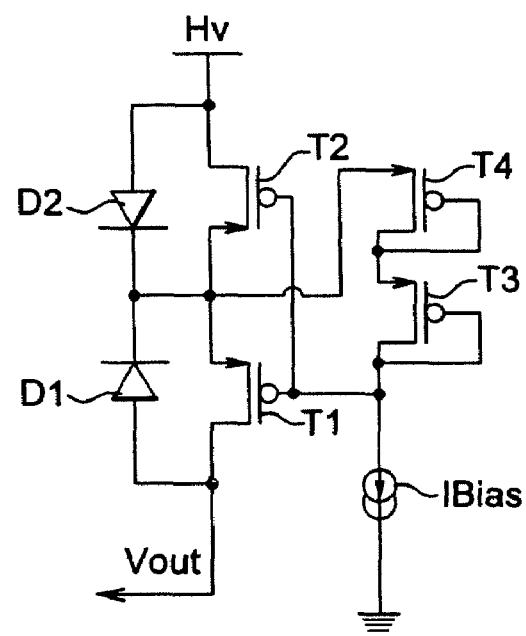
FIG. 1 shows a voltage level shifting device and an associated analog switch according to prior art.
Figure 2:
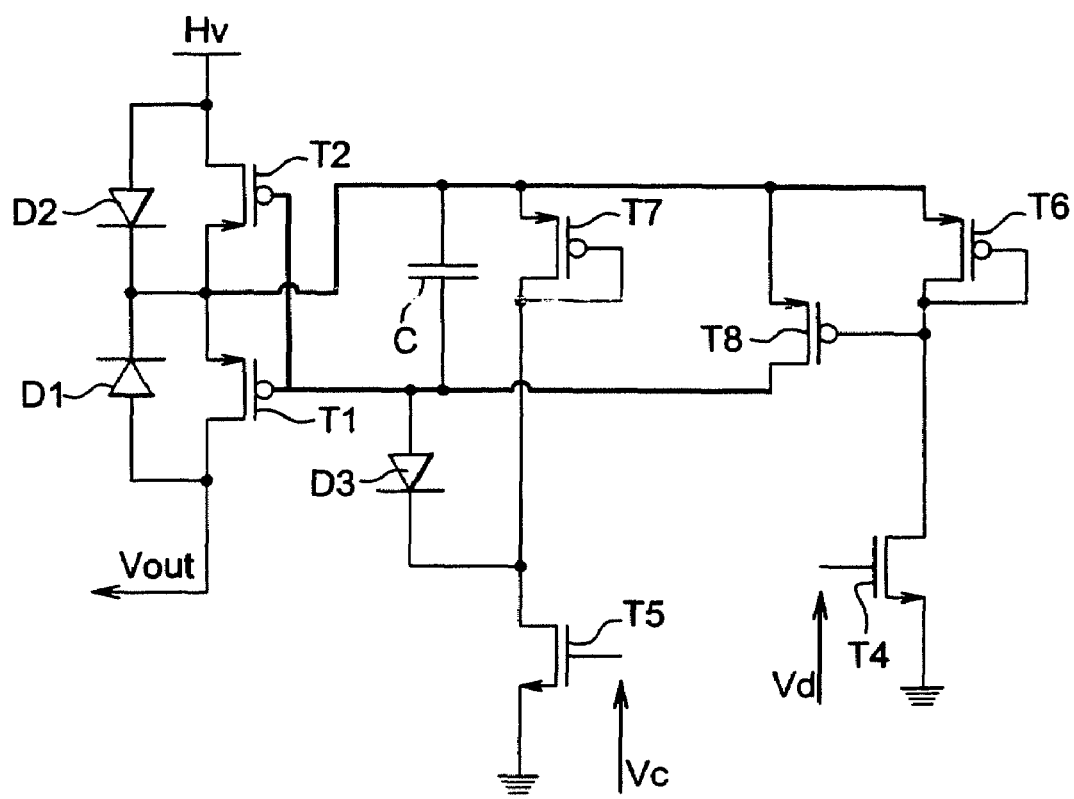
FIG. 2 shows a voltage level shifting device and associated analog switch according to prior art.
Figure 3:
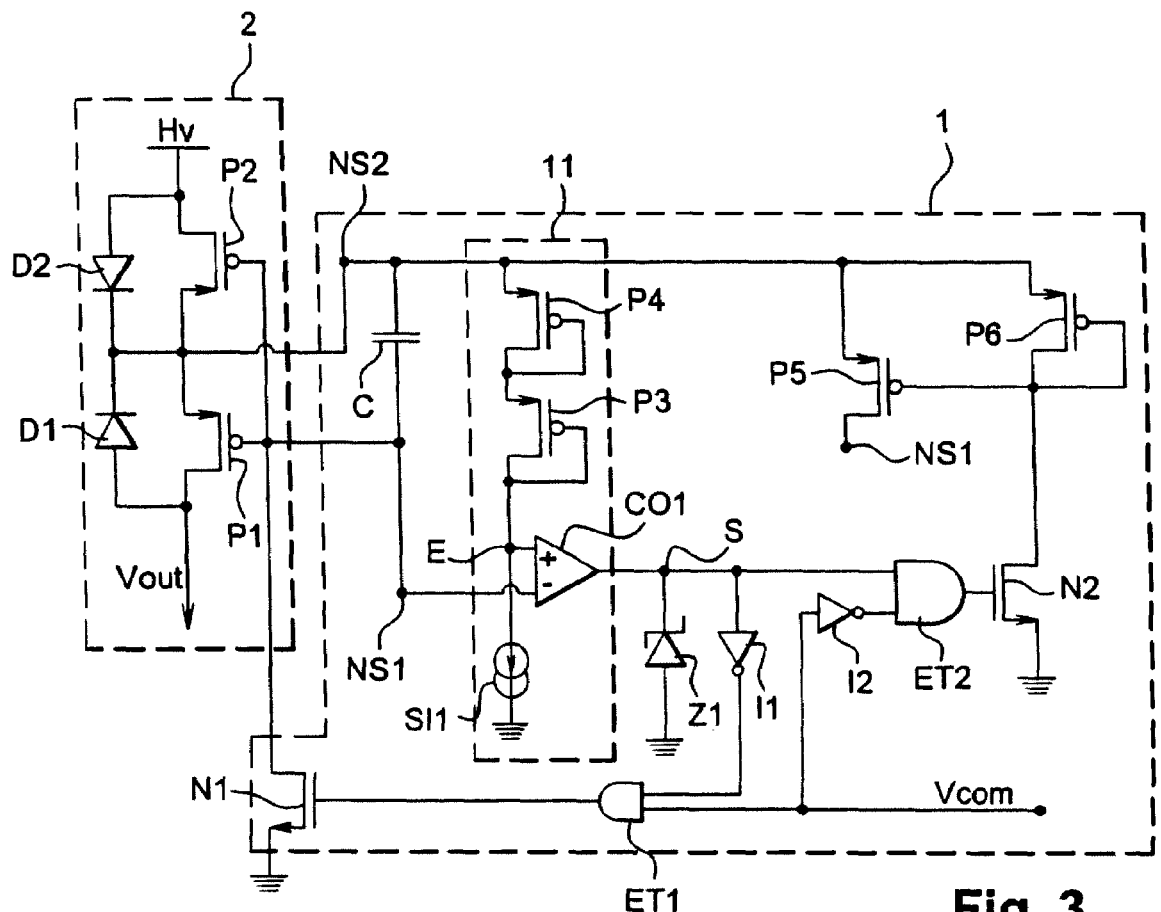
FIG. 3 shows a voltage level shifting device and an associated analog switch according to the invention.

FIG. 3 shows a voltage source including a voltage level shifting device 1 controlling an analog switch 2.

The switch 2 is coupled to the output nodes NS1 and NS2 of the shifting device 1 and includes two high-voltage thin gate oxide PDMOS transistors P1 and P2. The gates of P1 and P2 are coupled to the output node NS1. The sources of P1 and P2 are coupled to the output node NS2. The drain of P1 is coupled to an output node Vout and the drain of P2 is coupled to a high-voltage power supply input Hv. The head-to-tail parasitic diodes D1 and D2 of transistors P1 and P2 are shown.

High-voltage thin gate oxide PDMOS transistors typically have a gate oxide of less than 60 nanometers. Such transistors generally have a maximum drain-gate voltage of less than 20 volts, but have a threshold voltage Vt clearly lower than that of high-voltage thick gate oxide PDMOS transistors. Output transistors P1 and P2 are therefore optimal for a switch 2 receiving a voltage Hv less than or equal to 35 volts.

The switching of the switch 2 is controlled by a charge of a discharge of a capacitor C present between the output nodes NS1 and NS2 of the voltage level shifting device 1. A charge of the capacitor C turns the switch 2 on, and a discharge of the capacitor turns the switch 2 off. The shifting device 1 therefore manages the charge and discharge of the capacitor C and locks the voltage at the terminals of said capacitor C at a level below the voltage $V_{GS\ Max}$ of transistors P1 or P2.

Device 1 includes a high-voltage NDMOS transistor N1 of which the source is coupled to the ground and of which the drain is coupled to the output node NS1. The device 1 also includes a comparator device 11. This device 11 includes low-voltage PMOS transistors P3 and P4, a current source SI1 and a comparator CO1. Transistors P3 and P4 are diode-connected and arranged in series between output node NS2 and a node E. The source of P4 is coupled to node NS2 and the drain of P3 is coupled to node E. The current source SI1 is coupled between the node E and the ground. The voltage comparator CO1 has its inverting input coupled to node NS1 and its non-inverting input coupled to node E. The output of the comparator CO1 is coupled to node S. A Zener diode Z1 is coupled between the ground and node S, and its anode is coupled to the ground. An inverter I1 is coupled between the node S and an input of an AND gate designated by ET1. The output of the gate ET1 is applied to the gate of N1 and its other input is coupled to a control node Vcom. An inverter I2 is coupled between the control node Vcom and an AND gate designated by ET2. The node S is coupled to another input of ET2. The output of ET2 is coupled to the gate of a high-voltage NDMOS transistor N2. The source of N2 is coupled to the ground and its drain is coupled to the drain of a diode-connected PMOS transistor P6. The source of transistor P6 is coupled to the output node NS. A PMOS transistor P5 has its drain coupled to node NS1, its source coupled to node NS2 and its gate coupled to the drain of P6.

A low logic level of the control input Vcom in this case corresponds to a deactivation control of device 1. A deactivation control at the control input Vcom is intended to open the switch 2. By contrast, a high logic level of the control input Vcom corresponds to an activation control of device 1 and is intended to close the switch 2.

In this embodiment, the comparator CO1 is used both to interrupt the charge of the capacitor C so as to protect transistors P1 and P2 and to launch the discharge of the capacitor C so as to limit the parasitic conduction of the switch 2.

Transistors P3 and P4 and the current source SI1 define a threshold voltage applied to the non-inverting input of CO1. In the embodiment shown, the voltage difference generated between node NS2 and node E is 5 volts. In the absence of a sufficient charge of capacitor C, the voltage of node NS1 is higher than the voltage of node E: a low logic level is then applied to node S. When there is an overvoltage at the terminals of capacitor C or when there is a parasitic current coming from switch 2, the voltage of node NS1 may fall below the voltage of node E: then, a high logic signal is applied to node S. A high logic signal at node S is thus representative of either a parasitic charge of capacitor C or an excessive voltage at the terminals of capacitor C. The signal applied by CO1 to the node S is therefore representative of a state of charge of the capacitor C.

The diode Z1 makes it possible to stabilize the high logic level of node S at the desired level for the inputs of logical operators I1, I2, ET1 and ET2, for example at 5 volts for low-voltage controls.

When a high logic level is applied to node S, a low logic level is applied to the input of ET1 coupled to I1. The gate ET1 then turns the charging transistor N1 off, regardless of the signal applied to the control input Vcom. The charge of the capacitor C is then interrupted. The input of ET2 coupled to node S receives a high logic level. The gate ET2 turns the discharging transistor N2 on only if a low logic level is applied to the control input Vcom. When N2 is turned on, the capacitor C is short-circuited by the transistor P5 which has been turned on, and is discharged. The switch 2 is then open.

When a low logic level is applied to node S, N2 is kept off regardless of the level of the control applied to input Vcom. A high logic level is applied to the input of ET2 coupled to I1. If an activation control is applied to input Vcom, N1 is turned on and capacitor C is charged; when the charge of capacitor C is sufficient, switch 2 is closed.

The following table summarizes the various cases of operation of the shifting device.

| Vcom | S | Case | State N1 | State N2 |
|---|---|---|---|---|
| 1 | 1 | Device 1 activated and overvoltage | Off | Off |
| 1 | 0 | Device 1 activated and no overvoltage | On | Off |
| 0 | 1 | Device 1 deactivated and parasitic or residual charge | Off | On |
| 0 | 0 | Device deactivated and limited parasitic or residual charge | Off | Off |

Figure 4:
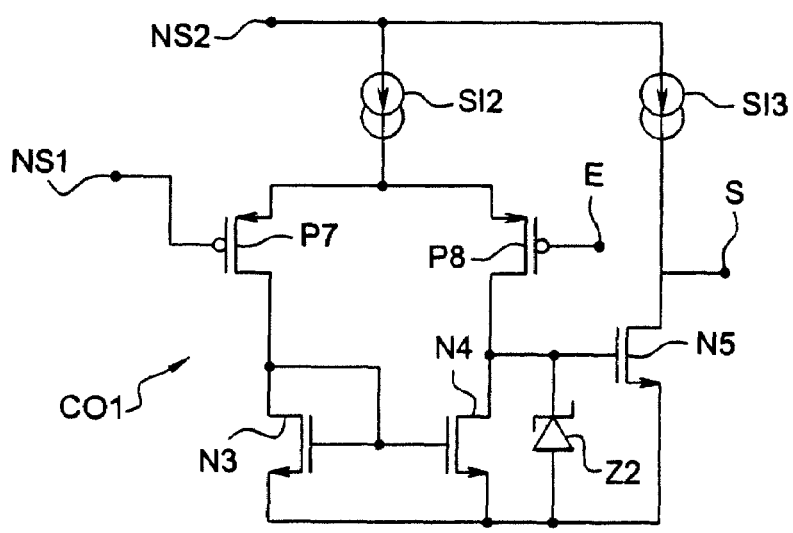
FIG. 4 shows an embodiment of the comparator of FIG. 3.

FIG. 4 shows a possible embodiment of comparator CO1. Comparator CO1 includes NMOS transistors N3, N4 and N5, high-voltage PDMOS transistors P7 and P8, a Zener diode Z2 and current sources SI2 and SI3.

The sources of transistors N3, N4 and N5 and the anode of diode Z2 are coupled together. Transistor N3 is diode-connected and its gate is coupled to the gate of N4. The drain of N4, the gate of N5 and the cathode of Z2 are coupled together. The drain of N5 is coupled to node S. The drain of P7 is coupled to the drain of N3. The gate of P7 is coupled to the output node NS1. The source of P7 is coupled to the source of P8. The gate of P8 is coupled to node E and its drain is coupled to the drain of N4. The current source SI2 is coupled between the output node NS2 and the source of P7. The current source SI3 is coupled between node NS2 and node S.

Figure 5:
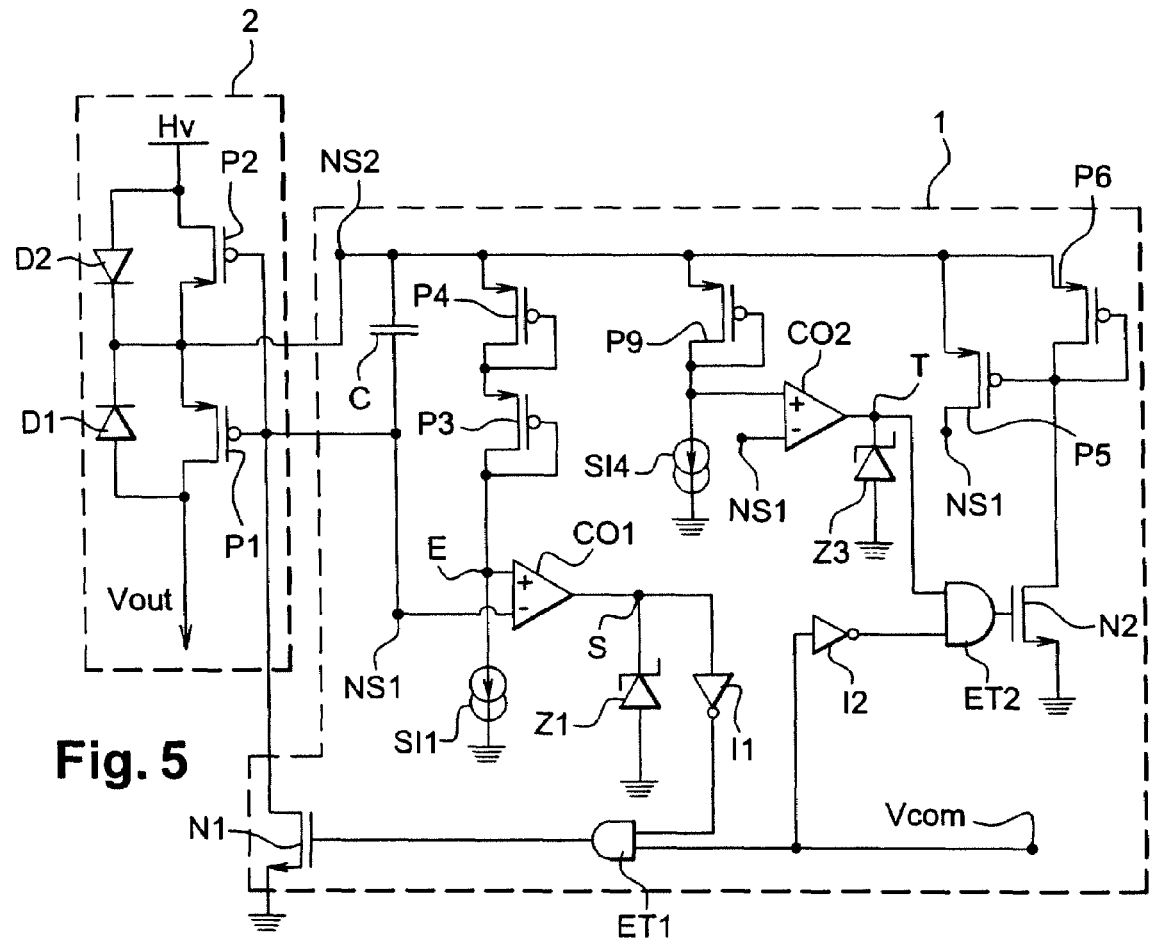
FIG. 5 shows an alternative of the device of FIG. 3.

FIG. 5 shows the use of an alternative of the shifting device of FIG. 3, intended to prevent any conduction when there is a parasitic charge of the capacitor C. The comparator device thus includes first and second voltage comparators CO1 and CO2.

In this alternative, the connection between an input of gate ET2 and node S is suppressed. This input is then coupled to a node T. A Zener diode Z3 is coupled between the ground and node T, with its anode being coupled to the ground. Node T is coupled to the output of a voltage comparator CO2. A current source SI4 is coupled between the ground and the non-inverting input of comparator CO2. The inverting input of comparator CO2 is coupled to node NS1. A PMOS transistor P9 is diode-connected between the non-inverting input of CO2 and node NS2. Its source is coupled to node NS2.

Comparator CO1 is intended to detect an overvoltage at the terminals of capacitor C when the device 1 is activated, while comparator CO2 is intended to control the discharge of the capacitor C when the device 1 is deactivated or when a parasitic charge of this capacitor appears.

The discharge of the capacitor C can be controlled before the switch 2 is closed by the parasitic charge. Comparator CO2 indeed detects a voltage difference below the level necessary to turn P1 and P2 on. Therefore, the current source SI4 and P9 generate a threshold voltage on the order of 2.5 volts between the non-inverting input of CO2 and node NS1. Thus, CO2 applies a high logic state signal to node T when the voltage difference at the terminals of the capacitor C reaches 2.5 volts, i.e. when this voltage difference is insufficient to close the switch 2. The over consumption generated by the discharge of the capacitor C is then particularly low when there is a parasitic charge of capacitor C.

The following table summarizes the various cases of operation of this shifting device 1.

| Vcom | S | T | Case | N1 | N2 |
|---|---|---|---|---|---|
| 1 | 1 | 1 | Device 1 activated and overvoltage | Off | Off |
| 1 | 0 | 1 | Device 1 activated and no overvoltage | On | Off |
| 1 | 0 | 0 | | | |
| 0 | 1 | 1 | Device 1 has just been deactivated | Off | On |
| 0 | 0 | 1 | Device 1 deactivated and parasitic or residual charge | Off | On |
| 0 | 0 | 0 | Device 1 deactivated and reduced parasitic or residual charge | Off | Off |

Figure 6:
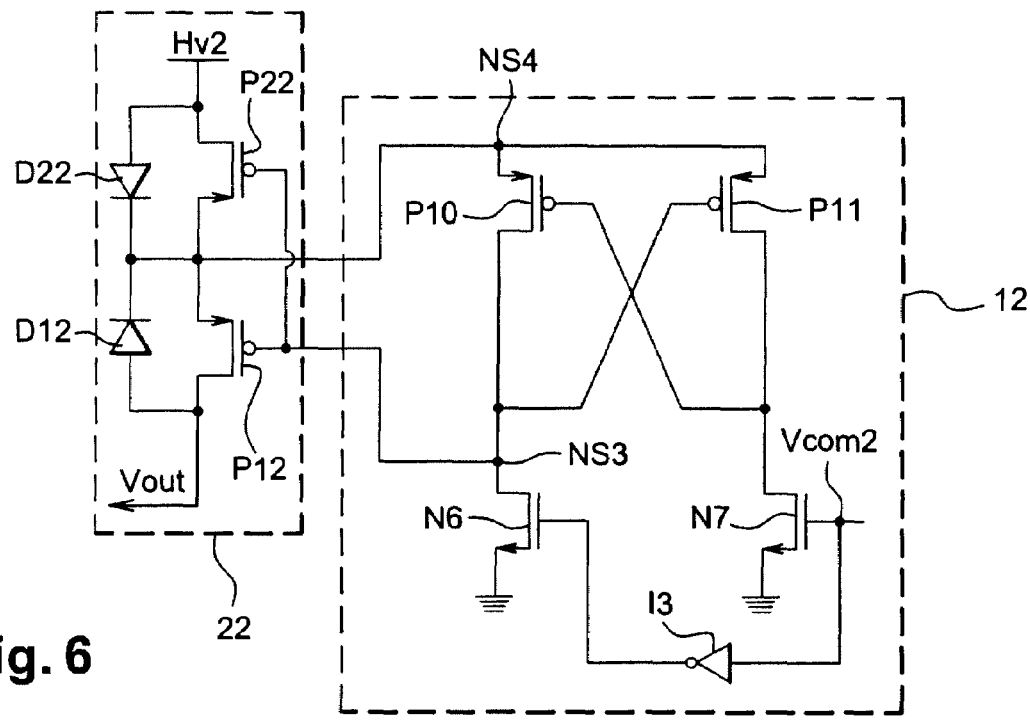
FIG. 6 shows a voltage source capable of being combined with the voltage shifting device and the switch according to the invention.

FIG. 6 shows a voltage source including a voltage level shifting device 12 controlling an analog switch 22 according to a different technology. This voltage source is advantageously coupled to a switch 2 and to a device 1 according to the invention.

The voltage level shifting device 12 includes first and second output nodes NS3 and NS4. Device 12 also includes first and second high-voltage thick gate oxide PMOS transistors P10 and P11. The drain of P10 is coupled to the first output node NS3 and its source is coupled to the second output node NS4. The source of P11 is coupled to the second output node NS4. The gates of P10 and P11 are respectively coupled to the drains of P11 and P10.

A thick gate oxide or TGO transistor generally refers to a transistor of which the gate oxide ha a thickness greater than 200 nm. The thickness of the gate oxide of such a transistor is typically on the order of 300, 500 or 750 nm. The maximum gate-source voltage of such a transistor is typically greater than 90 volts.

Device 12 also includes third and fourth high-voltage NDMOS transistors N6 and N7. The drains of N6 and N7 are respectively coupled to the drains of P10 and P11. The sources of N6 and N7 are coupled to the ground.

Device 12 also includes a control input Vcom2. The logic level of the control input Vcom2 is applied to the gate of transistor N7. The gate of transistor N6 is coupled to the control input Vcom2 by means of an inverter I3.

The switch 22 is coupled to the output nodes NS3 and NS4 and includes two high-voltage thick gate oxide PMOS transistors P12 and P22. The gates of P12 and P22 are coupled to the output node NS3. The sources of P12 and P22 are coupled to the output node NS4. The drain of P12 is coupled to an output node Vout and the drain of P22 is coupled to a high-voltage power supply input Hv2.

Transistors P10 and P11 are intended to control the switching of transistors P12 and P22 by charging the parasitic capacitors present on node NS3. These capacitors are primarily formed by the casings of P10 and N6. When a low logic level is applied to the control input Vcom2, the analog switch 22 is turned on. Transistors N7 and P10 are off. Transistor N6 is turned on and causes transistors P11, P12 and P22 to be turned on by pulling their gates to the ground. The power supply voltage applied to the input Hv2 is thus reproduced on the output node Vout.

When a high logic level is applied to the control input Vcom2, transistors N6 and P11, P12 and P22 are blocked. Transistor N7 is turned on and causes transistor P10 to be turned on. When the level at the output node Vout exceeds the level Hv2, the voltage at the output node NS4 becomes Vout−Vd12 (Vd12 being the threshold voltage of diode D12). As the solution proposed works without the capacitor between output nodes NS3 and NS4, the switch 22 is not turned on by this voltage level at node NS4. The switching of transistors P12 and P22 is thus insensitive to the voltage levels at the node Vout. A continuous current overconsumption is thus prevented. In addition, the control signal to be applied to the input Vcom2 is continuous for a given conduction state of the switch 22. The circuits generating the controls of device 12 can thus be considerably simplified. The surface of the substrate used to integrate the switch 22, the device 12 and its control circuit can thus be reduced.

Transistors P10, P11, P12 and P22 are high-voltage thick gate oxide transistors capable of resisting the voltage levels of nodes Vout and Hv2 capable of being applied to their gates and drain-source voltage levels capable of being applied thereto.

As device 12 and switch 22 are capable of being integrated in a high-voltage multiplexer, the voltage levels Vout and Hv2 capable of being applied are greater than 20 volts and can be up to 80 volts, 90 volts, 100 volts or more. As transistors P12, P22, P10 and P11 have a voltage Vt on the order of 9V, the analog switch and the voltage level shifting device are particularly suitable for a voltage level Hv2 over 20 volts, and in particular when this voltage level is above 50 volts, or even 100 volts.

Figure 7:
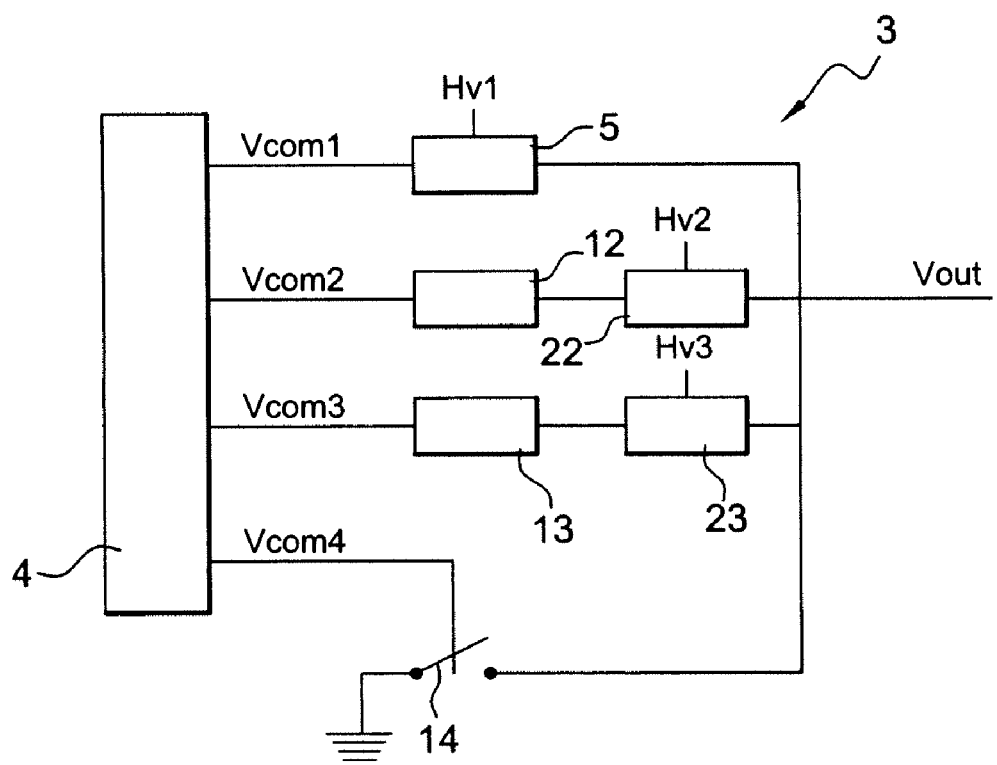
FIG. 7 diagrammatically shows a voltage multiplexer including a voltage source according to FIG. 6 and a voltage level shifting device and an analog switch according to the invention.

FIG. 7 shows a voltage multiplexer 3 according to the invention. The voltage multiplexer 3 includes a control device 4 providing control signals to various voltage sources. The multiplexer 3 includes a voltage source 5, a shifting device 12 and a switch 22 as described in reference to FIG. 6, a shifting device 13 and a switch 23 as described in reference to FIG. 3, and an interrupter 14.

Voltage source 5 receives a power supply voltage greater than Hv1, switch 22 receives a high intermediate voltage Hv2, switch 23 receives a low intermediate voltage Hv3 and the interrupter 14 has one terminal coupled to the ground and another terminal coupled to the output node Vout.

Voltage source 5, voltage level shifting devices 12 and 13 and the interrupter 14 receive respective control signals at the inputs Vcom1 to Vcom4. The control device 4 selectively provides a control signal activating the source 5, devices 12 or 13, or the underreport 14, so that one of the power supply voltages Hv1, Hv2, Hv3 or the ground voltage is applied to the output node Vout.

A combination of a device 12 and a switch 22 is favored for high intermediate voltages, i.e. voltages for which the voltage Vt of the thick gate oxide transistors is not too detrimental. This combination can, for example, be used for voltages greater than or equal to 30 volts.

While in practice it occupies a substrate surface greater than the previous combination, a combination of a device 13 and a switch 23 is favored for low intermediate voltages, i.e. voltages for which the voltage Vt of the thick gate oxide transistors would be too detrimental. This combination can, for example, be used for voltages less than or equal to 35 volts.

Such a voltage multiplexer 3 can, for example, be integrated in a display driver device. Such a display device is, for example, a liquid crystal screen of a digital apparatus of which the pixel electrodes are selectively coupled to the output voltage supplied by the multiplexer 3.

The display device or display screen has, for example, a display matrix with cholesteric liquid crystals, with electronic liquid powder pixels or any other type of pixel using at least three control voltage levels, of which at least two are high voltage levels.

While there have been described above the principles of the present invention in conjunction with specific memory architectures and methods of operation, it is to be clearly understood that the foregoing description is made only by way of example and not as a limitation to the scope of the invention. Particularly, it is recognized that the teachings of the foregoing disclosure will suggest other modifications to those persons skilled in the relevant art. Such modifications may involve other features which are already known per se and which may be used instead of or in addition to features already described herein. Although claims have been formulated in this application to particular combinations of features, it should be understood that the scope of the disclosure herein also includes any novel feature or any novel combination of features disclosed either explicitly or implicitly or any generalization or modification thereof which would be apparent to persons skilled in the relevant art, whether or not such relates to the same invention as presently claimed in any claim and whether or not it mitigates any or all of the same technical problems as confronted by the present invention. The applicants hereby reserve the right to formulate new claims to such features and/or combinations of such features during the prosecution of the present application or of any further application derived therefrom.

We claim:

1. A voltage level shifting device, comprising:
   a control input for receiving an activation or deactivation control;
   first and second output nodes;
   a capacitor coupled between the first and second output nodes, the capacitor having terminals;
   a charging transistor capable of charging the capacitor;
   a discharging transistor, capable of discharging the capacitor;
   a control device for generating a charge blocking signal to turn off the charging transistor when the voltage at the first output node exceeds a first threshold or the activation signal is inactive, and for generating a discharge signal to turn on the discharging transistor when the voltage at the first output node exceeds a second threshold and the activation signal is inactive.

2. The voltage level shifting device according to claim 1, wherein the control device comprises a comparator device having said first and second thresholds having different values.

3. The voltage level shifting device according to claim 2, in which the comparator device includes a comparator having a non-inverting input coupled to the second output node through two series diode-connected PMOS transistors and coupled to ground by a current source.

4. The voltage level shifting device according to claim 2 further comprising a Zener diode wherein the anode is coupled to ground and the cathode is coupled to the output of the voltage comparator.

5. The voltage level shifting device according to claim 2, in which the comparator device comprises:
   a first voltage comparator applying the charge blocking signal to its output when the voltage difference at the capacitor terminals exceeds the first threshold; and a second voltage comparator applying the discharge signal to its output when the voltage difference at the capacitor terminals exceeds the second threshold, which is lower than the first threshold.

6. The voltage level shifting device according to claim 5, wherein the comparators each comprise an inverting input coupled to the first output node, the first comparator comprises a non-inverting input coupled to the second output node by two series diode-connected PMOS transistors and coupled to ground by a current source, and the second comparator comprises a non-inverting input coupled to the second output node by a diode-connected PMOS transistor and coupled to the ground by a current source.

7. The voltage level shifting device according to claim 5 further comprising two Zener diodes, wherein the anodes are coupled to ground and the cathodes are respectively coupled to the outputs of the first and second comparators.

8. The voltage level shifting device according to claim 2, in which the comparator device comprises:
    a first high-voltage PMOS transistor having a gate coupled to the first output node;
    a second high-voltage PMOS transistor having a gate coupled to the non-inverting input;
    a first diode-connected NMOS transistor having a drain coupled to a drain of the first PMOS transistor;
    a second NMOS transistor having a drain coupled to a drain of the second PMOS transistor, and having a source and a gate respectively coupled to a source and a gate of the first NMOS transistor; and
    a third NMOS transistor having a drain coupled to the output of the comparator, and a gate and a source respectively coupled to a drain and a source of the second NMOS transistor.

9. The voltage level shifting device according to claim 8 further comprising:
    a first current source coupled between the second output node and the source of the first PMOS transistor; and
    a second current source coupled between the second output node and the comparator output.

10. The voltage level shifting device according to claim 8 further comprising a Zener diode having an anode and a cathode respectively coupled to the source and drain of the second NMOS transistor.

11. The voltage level shifting device according to claim 1 further comprising:
    a first diode-connected PMOS transistor having a source coupled to the second output node;
    a second PMOS transistor having a source coupled to the second output node, and a drain coupled to the first output node, and a gate coupled to the drain of the first diode-connected PMOS transistor.

12. The voltage level shifting device according to claim 11 wherein the discharging transistor comprises a high-voltage NMOS discharging transistor having a source coupled to ground and a drain coupled to the drain of the first diode-connected PMOS transistor.

13. The voltage level shifting device according to claim 1, in which the charging transistor comprises a high-voltage NMOS transistor, having a source coupled to ground and a drain coupled to the first output node.

14. The voltage level shifting device according to claim 1, in which the control device comprises:
    a first AND logic gate having a first input coupled to the control input, a second input receiving the discharge signal and an output coupled to the gate of the discharging transistor; and
    a second AND logic gate having a first input coupled to the control input, a second input receiving the charge blocking signal and an output coupled to the gate of the charging transistor.

15. The voltage level shifting device according to claim 1 further comprising a high-voltage analog switch.

16. The voltage level shifting device according to claim 15 wherein the high-voltage analog switch further comprises a third output node and a power supply input.

17. The voltage level shifting device according to claim 16 wherein the high-voltage analog switch further comprises first and second high-voltage thin gate oxide transistors, each having first and second conduction electrodes and a gate, with their gates being coupled to the first output node of the device, their second conduction electrodes being coupled to the second output node of the device, and their first conduction electrodes being coupled respectively to the high-voltage power supply input and the third output node.

18. The voltage level shifting device according to claim 16, further comprising a power supply under 35 volts coupled to the power supply input.

19. A voltage multiplexer comprising:
    at least one voltage level shifting device, comprising:
    a control input for receiving an activation or deactivation control;
    first and second output nodes;
    a capacitor coupled between the first and second output nodes and including terminals;
    a high-voltage charging transistor, capable of charging the capacitor;
    a high-voltage discharging transistor, capable of discharging the capacitor;
    a comparator device generating a charge blocking signal when the voltage at the first output node exceeds a first threshold, and generating a discharge signal when the voltage at the first output node exceeds a second threshold; and
    a control device for turning off the charging transistor when the charge blocking signal is generated, and for turning on the discharging transistor upon receipt of a deactivation control signal and when the discharge signal is generated; and
    at least one voltage source coupled to the at least one voltage level shifting device.

20. The voltage multiplexer of claim 19 further comprising an additional control device for providing control signals to the at least one voltage source.

* * * * *